(12) United States Patent
Stanzl et al.

(10) Patent No.: US 6,801,652 B1
(45) Date of Patent: Oct. 5, 2004

(54) METHOD FOR CHECKING THE PRESENTATION OF COMPONENTS TO AN AUTOMATIC ONSERTING UNIT

(75) Inventors: Harald Stanzl, Munich (DE); Jochen Prittmann, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/303,642

(22) Filed: May 3, 1999

(30) Foreign Application Priority Data

Sep. 29, 1998 (DE) ......................................... 198 44 661

(51) Int. Cl.⁷ ................................................ G06K 9/00
(52) U.S. Cl. ........................ 382/147; 382/146; 382/151
(58) Field of Search .................................. 382/141–152; 348/86, 87, 125, 126; 250/559.3, 559.34; 702/94, 95, 159; 356/373, 375, 399; 716/4, 5; 29/705, 740, 832

(56) References Cited

U.S. PATENT DOCUMENTS

| | | | |
|---|---|---|---|
| 5,088,187 A | * 2/1992 | Takata et al. ................. | 29/705 |
| 5,099,522 A | 3/1992 | Morimoto | |
| 5,212,881 A | * 5/1993 | Nishitsuka et al. ........... | 29/740 |
| 5,490,084 A | * 2/1996 | Okubo et al. ................. | 716/4 |
| 5,667,129 A | 9/1997 | Morita et al. | |
| 6,044,169 A | * 3/2000 | Hirotani et al. ............. | 382/145 |
| 6,176,011 B1 | * 1/2001 | Shirakawa .................... | 29/832 |
| 6,246,789 B1 | * 6/2001 | Hosotani et al. ............ | 382/151 |

FOREIGN PATENT DOCUMENTS

| | | |
|---|---|---|
| DE | 38 23 836 A1 | 1/1990 |
| DE | 42 32 036 A1 | 3/1994 |
| JP | 07-175894 | 7/1995 |

OTHER PUBLICATIONS

Patent Abstracts of Japan, vol. 017, No. 403 (E–1254), Aug. 26, 1992 & JP04–133500A (NEC Tohoku, Ltd. ) May 7, 1992.
Qualitatssicherung, *Null Fehler im Hühnerfutter!*, Messen, Prüfen, Automatisieren, Nov. 12, 1997, p. 36.

* cited by examiner

*Primary Examiner*—Vikkram Bali
(74) *Attorney, Agent, or Firm*—Harness, Dickey & Pierce, P.L.C.

(57) ABSTRACT

A method for checking the fitting at automatic onserting units for the onserting of substrates with components, comprising the steps of: taking a picture of the surface of a component to be onserted positioned in a delivery means with a camera; comparing the picture in an image evaluation unit following the camera to a stored pattern of the component to be onserted; given agreement in the comparison, onserting the component onto the substrate; and given disagreement in the comparison, outputting an error message.

7 Claims, 1 Drawing Sheet

METHOD FOR CHECKING THE PRESENTATION OF COMPONENTS TO AN AUTOMATIC ONSERTING UNIT

BACKGROUND OF THE INVENTION

The invention is directed to a method for checking the presentation of components to automatic equipping units.

In the automatic onserting (equipping) of substrates (for example, printed circuit boards or ceramic substrates) with SMD components (SMD=surface mounted device), the individual components are taken from a delivery means with an onserting (equipping) head and are then positioned on the substrate in a predetermined position.

Checking whether the correct components are offered or presented in the delivery means has hitherto been manually undertaken by the operator. For a delivery means in the form of belts provided with component pockets or compartments, it is known to equip the reel members around which the belts are wound in the delivered condition with bar codes. These bar codes are read out before installation in the automatic outputting unit and thus allow a certain check as to the presence of the correct components. However, only the reel member is checked in such a check; whether the belt and reel member match is assumed.

SUMMARY OF THE INVENTION

It is an object of the invention to provide a method with which the checking of whether the correct components are offered in the delivery means for an automatic onserting unit ensues automatically.

To that extent, an embodiment of the invention provides a method for checking the offering of components to an automatic onserting unit for the onserting of substrates with the components, comprising the steps of:

taking a picture of the surface of a component to be onserted positioned in a delivery means with a camera;

comparing the picture in an image evaluation unit following the camera to a stored pattern of the component to be onserted;

given agreement in the comparison, onserting the component onto the substrate; and given disagreement in the comparison, outputting an error message.

Advantageously, a camera takes a picture of the surface of the component in the delivery means to be onserted before the onserting head takes it out of the delivery means. The term "surface" thereby also covers terminals of the component to be recognized from above. An image evaluation unit then compares the picture to a previously stored pattern of the component and the component is onserted only when the picture matches the pattern. This check ensues automatically with the camera and the image evaluation unit. It is not dependent on the operator and directly evaluates the component and not an intervening carrier, such as, for example, a reel member.

Advantageously, the position of the component in the delivery means can also be identified by the comparison of the picture to the pattern. As a result thereof, the onserting head can be brought into a position favorable for the pick-up before the component is picked up. This method also is particularly suitable for components that are located in pockets that are too big for the components so that the position of a component is initially only imprecisely known.

In a preferred embodiment of the invention, the stored pattern contains information such as company names, company logos or type designations that are identified on the picture of the component with the assistance of the image evaluation means for checking the fitting. Such identification can be in the form of written data.

In an embodiment of the invention, encoded characters (bar codes, matrix codes) or markings (function or position markings) applied on the surface of the component can also be identified with the image evaluation unit.

Given terminals recognizable from above, these also can be contained in the pattern in order to identify the correct fitting or the correct position of the components.

In an embodiment of the invention, the camera attached to the onserting head is advantageously employed for the recognition of substrate markings for the position recognition of the substrate.

These and other features of the invention are discussed in greater detail below in the following detailed description of the presently preferred embodiments with reference to the accompanying drawings.

DETAILED DESCRIPTION OF THE PRESENTLY PREFERRED EMBODIMENTS

Figure 1:
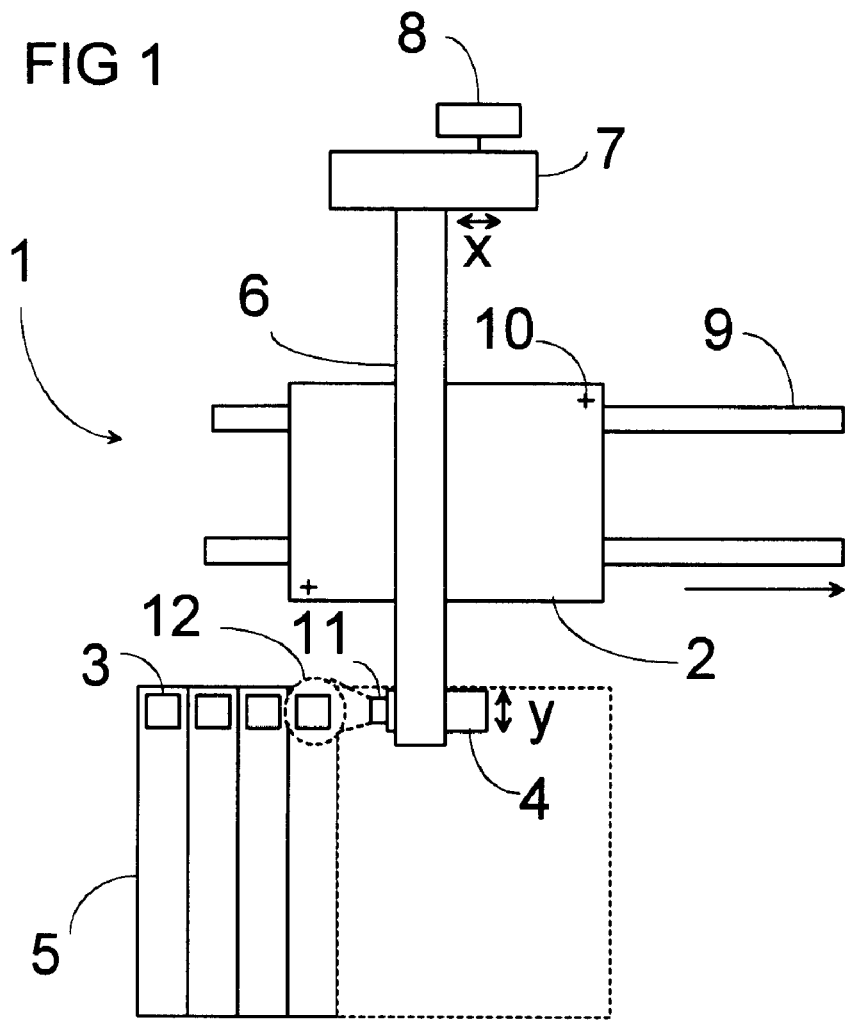
FIG. 1 is a schematic plan view of an automatic onserting unit with delivery devices.

FIG. 1 shows an automatic onserting unit 1 for the onserting of components onto a substrate 2 (for example, a printed circuit board or a ceramic substrate). For the onserting, the components are taken from a delivery means 5 with the assistance of a onserting head 4. The onserting head 4 is moved over the substrate 2 with the assistance of an x-y portal system 6, 7. A control means 8 sees to it that the component 3 is placed onto a previously defined position on the substrate 2. For the transport, the onserting head 4 comprises, for example, suction pipettes (not shown) that suction the component 3 up with vacuum pressure and, in turn, release it during placement. Additionally, a conveyor system 9 is shown on which the substrate 2 is conveyed through the automatic onserting unit and to further automatic processing units (for example, for onserting of further components) that are not shown.

The delivery devices 5 are thereby shown as belts that comprise pockets in which the components 3 are transported and offered. However, other delivery units such as, for example, flat magazines are known for which the inventive method can likewise be employed.

In order to recognize whether the correct components 3 are being supplied, a camera 11 is arranged at the onserting head 4, this registering an image of the component 3 in the delivery means 5 within a field of view 12. An image evaluation unit (not shown) following the camera 11 that, for example, can be allocated to the camera 11 or integrated in the control means 8 evaluates the image. To that end, the image is compared to a pattern of the component 3 that was previously stored in the image evaluation unit and that describes certain characteristics of the component 3. Included therein, for example, of the size and the shape of the component.

Figure 2:
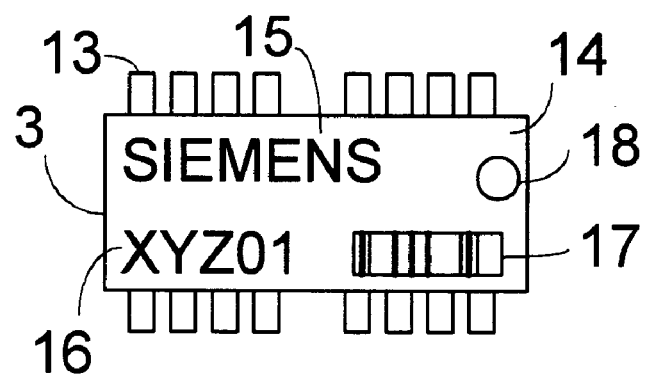
FIG. 2 is a schematic plan view of a component.

As shown in FIG. 2, further features of the surface 14 of the component 3 can be included. These features can include: written characters such as company designations or company logos 15, typed designations 16 of the component 3, encoded characters 17 such as bar codes or matrix codes or other markings 18 applied, for example, with laser writing. The position of the terminals 13 at the component 3, insofar as recognizable from above, can also be part of the pattern and be utilized for the evaluation.

On the basis of the pattern comparison that is implemented with known methods for image evaluation, it can be recognized, on the one hand, whether the correct components 3 are available. The unit of that determination leads to the decision as to whether the onserting head 4 picks up the component 3 and places it onto the substrate 2 or whether an error message is output.

Given specific pattern features, over and above this, the position of the component 3 can be recognized in the delivery means 5 when, for example, an angle between the image of the writing 15 and the pattern of the writing 15 is recognized. This position, particularly a turned position, can then already be taken into consideration by the onserting head 4 before fetching the component 3, so that the onserting head 4 reliably approaches this fetching position.

Cameras 11 that are attached to the onserting head 4 are especially suitable for the method, these registering additional substrate markings 10 with reference to which the position of the substrate 2 is identified in the image evaluation unit before the onserting step.

Accordingly, an automatic checking of the provision of components to an automatic onserting units 1 is assured with the inventive method, the latter being suitable for various delivery devices 5.

Although modifications and changes may be suggested by those skilled in the art, it is the intention of the inventors to embody within the patent warranted hereon all changes and modifications as reasonably and properly come within the scope of their contribution to the art.

What is claimed is:

1. A method of checking the fitting provisions of components, each of which having a mounting surface and top surface that faces away from the mounting surface, to an automatic onserting unit for the onserting of substrates with the components, the method comprising:

taking a picture with a camera of the top surface of a component to be onserted as it is still positioned within a delivery device, the camera being attached to an onserting head, the delivery device being employed for transporting a plurality of components from an external location to a start position of the onserting process;

comparing the picture in an image evaluation unit to a stored pattern of the component to be onserted;

using the camera to inspect the substrate;

given agreement in the comparison, onserting the component onto the substrate, wherein onserting includes picking up the component in the delivery device using the onserting head and thereby placing the component onto the substrate such that the mounting surface of the component confronts the substrate; and given disagreement in the comparison, outputting an error message.

2. The method of claim 1, wherein the start position of the component in the delivery device is identified on the basis of the comparison between the picture and the stored pattern.

3. The method of claim 1 or claim 2, wherein the pattern contains information describing a written character applied on the top surface of the component.

4. The method of claim 1, wherein the pattern contains information describing an encoded identifier applied on the top surface of the component.

5. The method of claim 1, wherein the pattern contains information describing a marking applied on the top surface of the component.

6. The method of claim 1, wherein the pattern contains information describing a position of terminals of the component.

7. The method according to claim 1, wherein the picture includes one of a company designation, a company logo, designations relating to the component, encoded characters, barcode indicia, and markings.

\* \* \* \* \*